US008160831B1

(12) United States Patent
Rausch et al.

(10) Patent No.: US 8,160,831 B1
(45) Date of Patent: Apr. 17, 2012

(54) GYROSCOPE MONITORING FOR AN ANTENNA SYSTEM

(75) Inventors: Walter F. Rausch, Shawnee, KS (US); Mohammad Wasif Hussain, Ashburn, VA (US); Rushi D. Shah, Ashburn, VA (US); Harry W. Perlow, Tarpon Springs, FL (US); Mohan R. Tammisetti, South Riding, VA (US); Harold Wayne Johnson, Roach, MO (US)

(73) Assignee: Sprint Communications Company L.P., Overland Park, KS (US)

( * ) Notice: Subject to any disclaimer, the term of this patent is extended or adjusted under 35 U.S.C. 154(b) by 398 days.

(21) Appl. No.: 12/503,153

(22) Filed: Jul. 15, 2009

(51) Int. Cl.
*G06F 19/00* (2011.01)
*G01R 29/10* (2006.01)
*H01Q 3/00* (2006.01)

(52) U.S. Cl. ........................... 702/94; 343/703; 342/359

(58) Field of Classification Search .................... 702/94, 702/141, 151; 343/703, 709; 342/357.23, 342/357.28

See application file for complete search history.

(56) References Cited

U.S. PATENT DOCUMENTS

| | | | | |
|---|---|---|---|---|
| 3,893,123 | A | 7/1975 | Bieser | |
| 4,020,491 | A | 4/1977 | Bieser et al. | |
| 4,197,548 | A | 4/1980 | Smith et al. | |
| 4,433,337 | A | 2/1984 | Smith et al. | |
| 4,442,435 | A | 4/1984 | Kiryu et al. | |
| 4,596,989 | A | 6/1986 | Smith et al. | |
| 4,956,947 | A | 9/1990 | Middleton | |
| 5,270,723 | A * | 12/1993 | Lopez et al. | 343/703 |
| 5,894,291 | A | 4/1999 | Lee | |
| 2009/0284425 | A1 * | 11/2009 | Snow et al. | 343/703 |

* cited by examiner

*Primary Examiner* — Bryan Bui

(57) ABSTRACT

A gyroscope monitoring system operates with an antenna system that has a gyroscope that controls the position of multiple antennas. The monitoring system receives data indicating reference signal strengths and test signal strengths for the antennas. The monitoring system determines differences between the reference signal strengths and the test signal strengths. The monitoring system processes the differences to determine if the gyroscope has lost reference point accuracy, and if so, then the monitoring system generates an indication that the gyroscope has lost reference point accuracy. In some examples, the monitoring system also determines reference point offsets for the gyroscope and provides the offsets to the gyroscope for use in motion measurements.

20 Claims, 5 Drawing Sheets

GYROSCOPE MONITORING FOR AN ANTENNA SYSTEM

TECHNICAL BACKGROUND

Microwave antennas are mounted on support structures such as monopoles and lattice towers. The microwave antennas propagate Radio Frequency (RF) communication signals through the air over relatively narrow beam paths. If the support structure twists or sways, the beam path is directed away from the receiving antenna, and as a result, wireless communication quality decreases.

Some support structures include a gyroscope, control systems, and motors that re-position the antennas to compensate for structural tilt and sway. Typically, the gyroscope directly measures the tilt and sway, and the control systems translate the gyroscope measurements into motor control instructions to drive the motors. There may be several motor control systems and motors on a single structural support that are driven by one gyroscope.

A gyroscope has a reference point that indicates the "zero point" for azimuth and angle determinations. Typically, the reference point is the direction north and the horizontal—a tangent plane to the earth's surface. The gyroscope measures tilt or sway by measuring its own physical offset from the reference point. The gyroscope measures its own offset by analyzing variations in internal electromagnetic signals that are induced by motion in a gravitational field (tilt and sway). The gyroscope translates these electromagnetic variations into motion measurements that indicate movement away from the reference point. Unfortunately, the reference point itself may become inaccurate over time due to internal electronic degradation within the gyroscope.

Overview

A gyroscope monitoring system operates with an antenna system that has a gyroscope that controls the position of multiple antennas. The monitoring system receives data indicating reference signal strengths and test signal strengths for the antennas. The monitoring system determine differences between the reference signal strengths and the test signal strengths. The monitoring system processes the differences to determine if the gyroscope has lost reference point accuracy, and if so, then the monitoring system generates an indication that the gyroscope has lost reference point accuracy. In some examples, the monitoring system also determines reference point offsets for the gyroscope and provides the offsets to the gyroscope for use in motion measurements.

DETAILED DESCRIPTION

Figure 1:
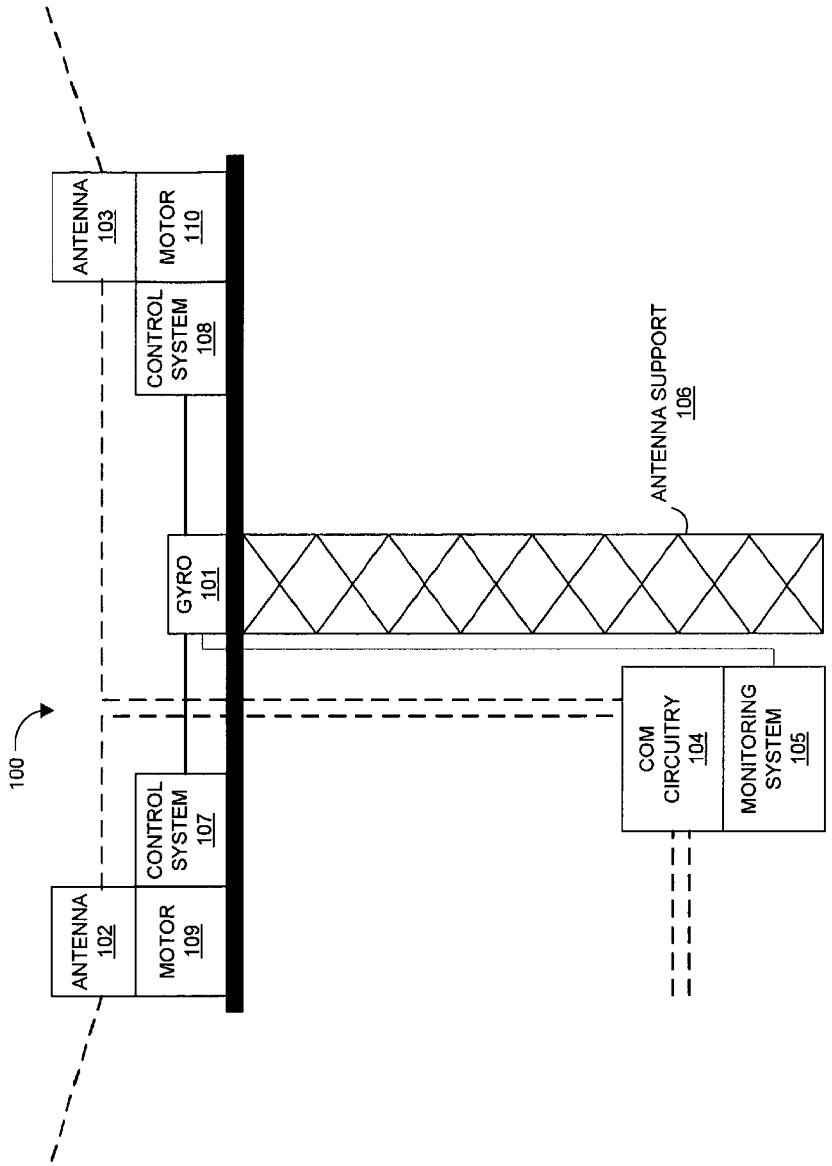
FIG. 1 illustrates an antenna system having a gyroscope monitoring system.

FIG. 1 illustrates antenna system 100. Antenna system 100 includes gyroscope 101, antennas 102-103, communication circuitry 104, gyroscope monitoring system 105, antenna structural support 106, control systems 107-108, and motors 109-110. Gyroscope 101, antennas 102-103, control systems 107-108, and motors 109-110 are mounted on a horizontal platform on structural support 106. Structural support 106 could be a monopole, lattice tower, building, or some other apparatus that supports antennas.

Communication circuitry 104 and monitoring system 105 are shown on the ground, but all or portions of these systems may also be mounted on structural support 106. In addition, all or portions of gyroscope monitoring system 105 could be located or distributed remotely. Gyroscope monitoring system 105 could be shared by other antenna systems.

Communications circuitry 104 comprises RF transceivers, modulators, signal processors, and other components typically found in a wireless base station. In operation, communication circuitry 104 receives communication signals from external systems (not shown). Communication circuitry 104 converts the communication signals from their native format into RF signals and transfers the RF signals to antennas 102-103. Driven by the RF signals, antennas 102-103 propagate corresponding RF waves into the air for reception by other antennas (not shown). Note that the RF waves are propagated in an electromagnetic beam at a specific geographic direction.

Antennas 102-103 also receive RF waves from the air that were transmitted by the other antennas (not shown). These RF waves are received in an electromagnetic beam that is propagating from a specific geographic direction. Antennas 102-103 convert the received RF waves into RF signals and transfer the RF signals to communication circuitry 104. Communication circuitry 104 converts the RF signals into communications signals in their native format and transfers the communication signals to the external systems (not shown).

During the above operation, gyroscope 101 measures the tilt or sway of support structure 106 and provides corresponding movement measurements to control systems 107-108. Control system 107 translates the movement measurements into motor instructions that will re-position antenna 102, so the transmitted RF beam retains its original direction, and the received RF beam is received from its original direction. Control system 107 transfers the motor instructions to motor 109, and motor 109 re-positions antenna 102 accordingly. Likewise, control system 108 translates the movement measurements into motor instructions that will re-position antenna 103 so the transmitted RF beam retains its original direction, and the received RF beam is received from its original direction. Control system 108 transfers the motor instructions to motor 110, and motor 110 re-positions antenna 103 accordingly.

When antenna system 100 is installed, antennas 102-103 are positioned for optimal RF signal strength, and these reference signal strength measurements are recorded for use by monitoring system 105. Note that the signal strength of antennas 102-103 refers to the strength of RF waves received by antennas 102-103 and/or to the strength of RF waves transmitted by antennas 102-103 and received by other antennas. Communication circuitry 104 determines the signal strength for RF waves received by antennas 102-103. Communication circuitry 104 communicates these signal strength measurements to monitoring system 105—possibly through intermediate systems. Other communication circuitry at remote sites determines the signal strength for RF waves transmitted by antennas 102-103, and this other communication circuitry communicates these signal strength measurements to monitoring system 105—also possibly through intermediate systems.

On a periodic or on-going basis, monitoring system 105 compares current RF signal strengths (referred to as test signal strengths) for antennas 102-103 to the recorded reference signal strengths to determine if gyroscope 101 is functioning properly. If only one of the antennas 102-103 exhibits a loss in signal strength while the other antenna maintains signal strength, then gyroscope 101 is probably not to blame. If both antennas 102-103 exhibit a similar loss in signal strength, then gyroscope 101 may not be functioning properly.

In particular, the gyroscope's reference point may be off due to internal electronic degradation. As gyroscope 101 loses its reference point accuracy, this degradation affects the signal strength of antennas 102-103 in ways that can be modeled and detected. Although only two antennas are shown for clarity, there are typically several more antennas that all rely on the same gyroscope. Through modeling various drifting reference point scenarios for multiple antennas, the expected differences between reference RF signal strengths and test RF signal strength are determined for various drifting reference points. The model may account for the location of each antenna relative to the gyroscope and the propagation direction of each antenna to develop a unique set of drifting reference point signatures for each antenna system. If monitoring system 105 detects one of the drifting reference point signatures for antenna system 100, then system 105 transmits an alarm indication that gyroscope 101 may be losing reference point accuracy.

Figure 2:
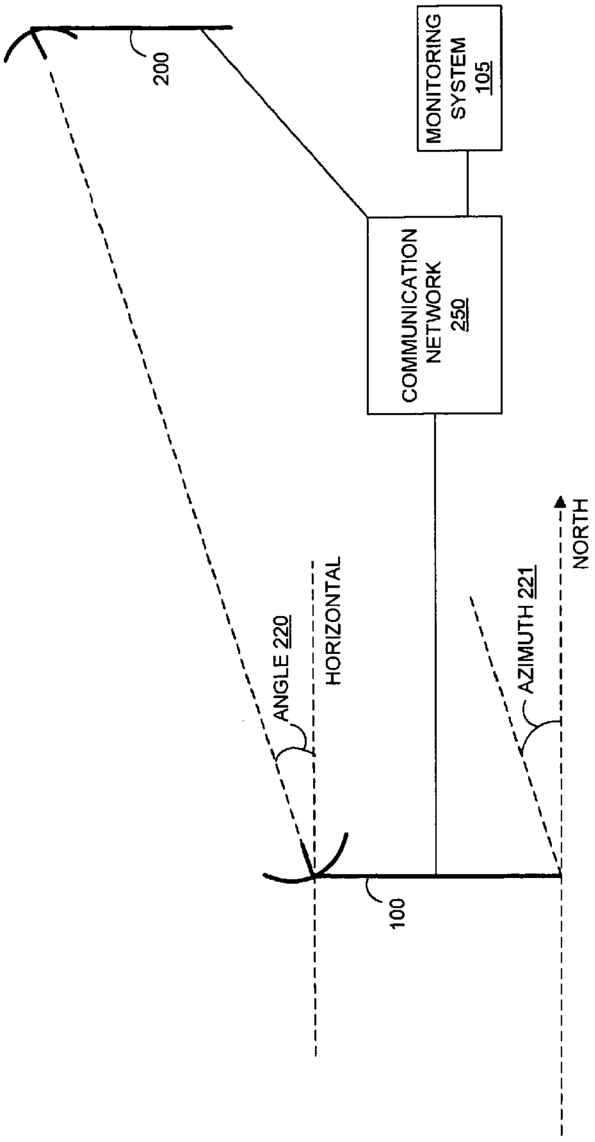
FIG. 2 illustrates antenna positioning for gyroscope monitoring.

FIG. 2 illustrates the positioning of antenna system 100. Antenna 102 exchanges RF beams with the antenna system 200. Antenna system 200 could be configured like antenna system 100. Angle 220 is the vertical angle between the propagation direction of antenna 102 and the horizontal (a parallel plane to the earth's surface). Azimuth 221 is the horizontal angle between the propagation direction of antenna 102 and the northern direction. Thus, the reference point for the gyroscope in this example is the horizontal and the direction north.

Angle 220 and azimuth 221 are initially determined for optimal RF signal strength when antenna system 100 is stationary and its gyroscope is functioning properly. If antenna system 100 should sway, then it will self-adjust angle 220 and azimuth 221 as needed to counter the sway and maintain the optimal RF signal strength. If the gyroscope in system 100 or 200 loses reference point accuracy, then the angle and azimuth self-adjustments will include errors and not be as effective.

In an alternative to FIG. 1, FIG. 2 shows gyroscope monitoring system 105 located remotely from both antenna systems 100 and 200. Antenna systems 100 and 200 communicate with monitoring system 105 over communication network 250. These communications include the transfer of RF signal strength data, and possibly the transfer of other data, such as local atmospheric conditions and calibration instructions.

Figure 3:
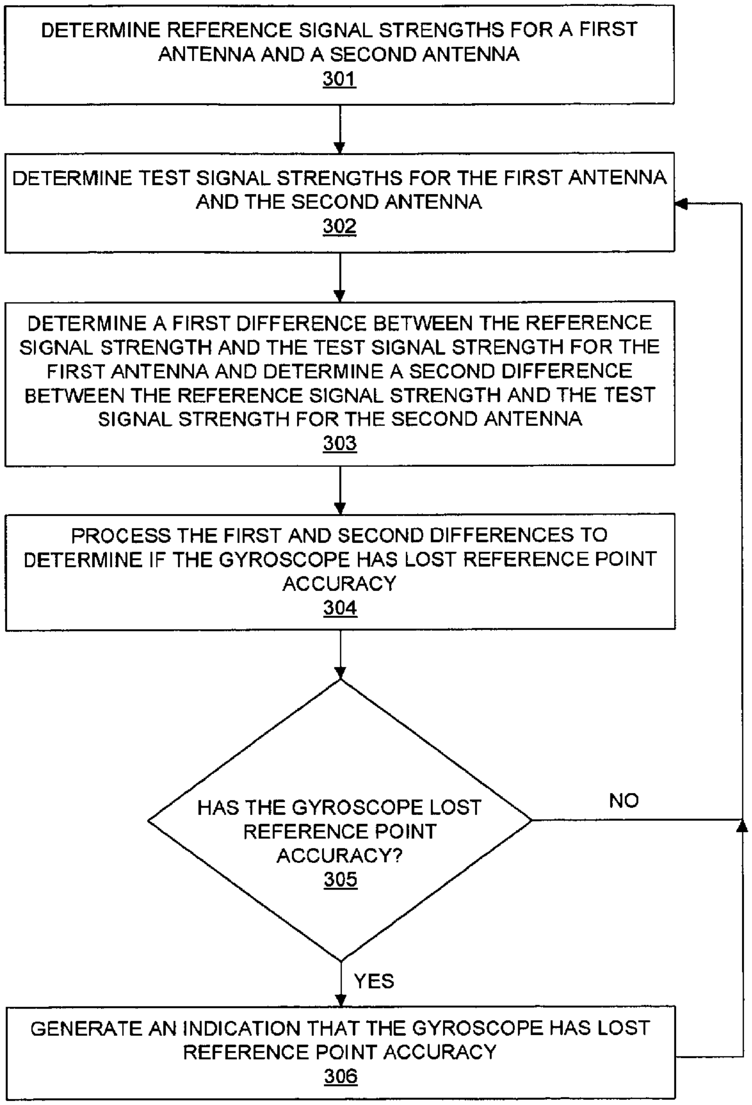
FIG. 3 illustrates the operation of the antenna system and the gyroscope monitoring system.

FIG. 3 illustrates the operation of antenna system 100. In step 301, reference signal strengths are determined for antennas 102-103 when the reference point of gyroscope 101 should be accurate. Subsequently in step 302, test signal strengths are determined for antennas 102-103 to determine if gyroscope 101 still has an accurate reference point. In step 303, monitoring system 105 determines the difference between the reference signal strengths and the test signal strengths for antennas 102-103. In step 304, monitoring system 105 processes the differences between the reference signal strengths and the test signal strengths for antennas 102-103 to determine if gyroscope 101 has lost reference point accuracy.

Monitoring system 105 processes the signal strength differences to identify a pattern match between the actual measured differences and the modeled differences that are expected in a drifting reference point scenario. In step 305, if monitoring system 105 determines that gyroscope 101 has lost reference point accuracy, then in step 306, monitoring system 105 generates an indication that gyroscope 101 may have lost reference point accuracy. However in step 305, if monitoring system 105 determines that gyroscope 101 has not lost reference point accuracy, then the process returns to step 302. Note that monitoring system 105 would typically use test data that is obtained under similar atmospheric conditions as the reference data. In addition, the above process may use averaging techniques to assess average differences between reference and test signal strengths.

Figure 4:
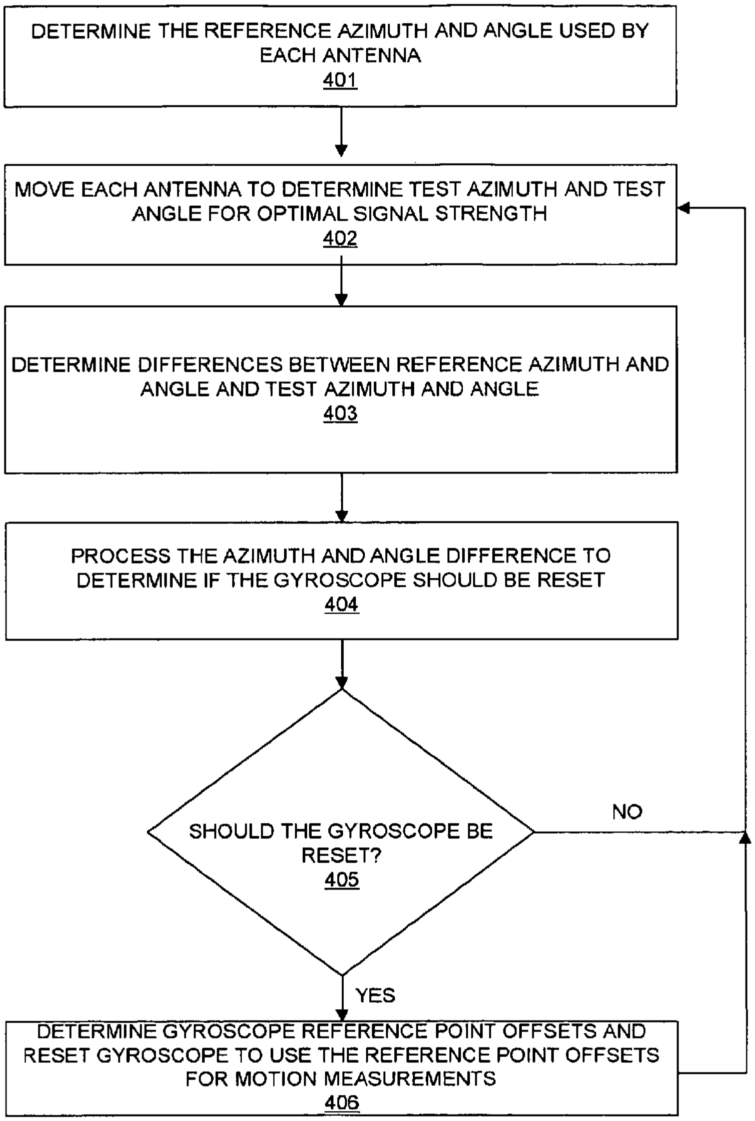
FIG. 4 illustrates the operation of the antenna system and the gyroscope monitoring system.

FIG. 4 illustrates the operation of antenna system 100. In step 401, the reference azimuth and angle used by antennas 102-103 for optimal RF signal strength is determined. In some cases, these are the azimuth and angle established during the installation of system 100 for optimal RF signal strength. In step 402, antenna system 100 iteratively re-positions antennas 102-103 to determine the current azimuth and angle that provides optimal signal strength—referred to as the test azimuth and angle. In step. 403, monitoring system 105 determines the differences between the reference azimuth and the test azimuth and between the reference angle and the test angle. In step 404, monitoring system 105 process the azimuth/angle differences to determine if gyroscope 101 should be reset. The determination to reset could be made if the differences between the reference azimuth/angle and the test azimuth/angle exceed a threshold. If the determination is not to reset gyroscope 101 in step 405, then the process returns to step 402—possibly awaiting a trigger to recommence.

If the determination in step 405 is to reset gyroscope 101, then in step 406, monitoring system 105 processes the signal strength difference data and the azimuth/angle difference data to determine reference point offsets for gyroscope 101. The reference point offsets are adjustments that gyroscope 101 can make internally to its reference point to counter the drift caused by electronic degradation. The reference point offsets are calculated to modify the motion measurements from gyroscope 101 as follows. When using the reference point offsets, gyroscope 101 provides motion measurements that drive control systems 107-108 and motors 109-110 to reposition antennas 102-103 to the test azimuth and test angle (as opposed to the reference azimuth and reference angle that are no longer effective due to the reference point drift). In step 406, monitoring system 105 transfers the reference point offsets to gyroscope 101, and gyroscope 101 implements the offsets. In some cases the offsets are constants that gyroscope 101 adds to or subtracts from its motion measurements.

Note that FIGS. 3-4 could be combine into one process. The process of FIG. 3 could be used to trigger the process of FIG. 4 if reference point drift is identified. Likewise, the process of FIG. 4 could be used to trigger the process of FIG. 3 if it is determined that gyroscope 101 needs to be reset.

Figure 5:
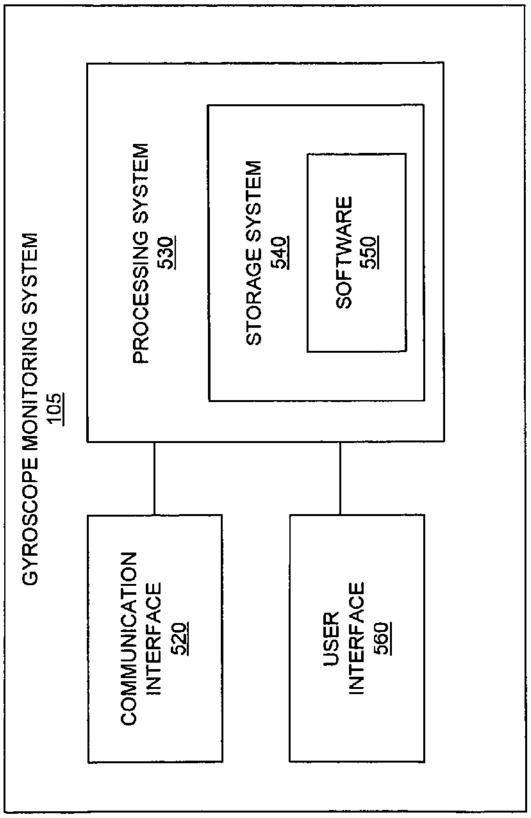
FIG. 5 illustrates the gyroscope monitoring system.

FIG. 5 is a block diagram illustrating gyroscope monitoring system 105. Gyroscope monitoring system 105 includes communication interface 520, processing system 530, and user interface 560. Processing system 530 includes storage system 540. Storage system 540 stores software 550. Processing system 530 is linked to communication interface 520 and user interface 560. Gyroscope monitoring system 105 could be comprised of a programmed general-purpose computer, although those skilled in the art will appreciate that programmable or special purpose circuitry and equipment may be used. Gyroscope monitoring system 105 may be distributed among multiple devices that together comprise elements 520-560.

Communication interface 520 could comprise a network interface, modem, port, transceiver, or some other communication device. Communication interface 520 may be distributed among multiple communication devices. Communication interface 520 is configured to receive the reference signal strength data, the test signal strength data, the reference angle/azimuth data, and the test angle/azimuth data. Communication interface 520 is configured to transfer an indication that the gyroscope has lost reference point accuracy and to transfer reference point offsets.

Processing system 530 could comprise a computer microprocessor, logic circuit, or some other processing device. Processing system 530 may be distributed among multiple processing devices. User interface 560 could comprise a keyboard, mouse, voice recognition interface, microphone and speakers, graphical display, touch screen, or some other type of user device. User interface 560 may be distributed among multiple user devices. Storage system 540 could comprise a disk, tape, integrated circuit, server, or some other memory device. Storage system 540 may be distributed among multiple memory devices.

Processing system 530 retrieves and executes software 550 from storage system 540. Software 550 may comprise an operating system, utilities, drivers, networking software, and other software typically loaded onto a computer system. Software 550 could comprise an application program, firmware, or some other form of machine-readable processing instructions. When executed by processing system 530, software 550 directs processing system 530 to operate as described herein. In particular, processing system 530 is configured to process the reference signal strength data and the test signal strength data to determine if the gyroscope has lost reference point accuracy and to generate a corresponding indication. Processing system 530 may also be configured to process the reference angle/azimuth data and the test angle/azimuth data to determine reference point offsets for the gyroscope.

The above description and associated figures teach the best mode of the invention. The following claims specify the scope of the invention. Note that some aspects of the best mode may not fall within the scope of the invention as specified by the claims. Those skilled in the art will appreciate that the features described above can be combined in various ways to form multiple variations of the invention. As a result, the invention is not limited to the specific embodiments described above, but only by the following claims and their equivalents.

What is claimed is:

1. A method of operating a gyroscope monitoring system for an antenna system that has a gyroscope that controls positioning of multiple antennas, the method comprising:

receiving reference data indicating a first reference signal strength for a first one of the antennas and a second reference signal strength for a second one of the antennas;

receiving test data indicating a first test signal strength for the first one of the antennas and a second test signal strength for the second one of the antennas;

processing the reference data and the test data to determine a first difference between the first reference signal strength and the first test signal strength and a second difference between the second reference signal strength and the second test signal strength;

processing the first difference and the second difference to determine if the gyroscope has lost reference point accuracy, and if the gyroscope has lost reference point accuracy, then generating an indication that the gyroscope has lost reference point accuracy.

2. The method of claim 1 further comprising determining reference point offsets for the gyroscope.

3. The method of claim 2 further comprising transferring the reference point offsets to the gyroscope, wherein the gyroscope uses the reference point offsets for motion measurement.

4. The method of claim 2 wherein determining the reference point offsets for the gyroscope comprises processing a difference between a reference angle previously used for optimal signal strength and a test angle that currently provides optimal signal strength.

5. The method of claim 4 wherein determining the reference point offsets for the gyroscope comprises processing a difference between a reference azimuth previously used for optimal signal strength and a test azimuth that currently provides optimal signal strength.

6. The method of claim 5 wherein determining reference point offsets for the gyroscope comprises processing the first difference between the first reference signal strength and the first test signal strength and the second difference between the second reference signal strength and the second test signal strength.

7. The method of claim 2 wherein determining reference point offsets for the gyroscope comprises determining the reference point offsets in response to determining that the gyroscope has lost reference point accuracy.

8. The method of claim 1 wherein processing the first difference and the second difference to determine if the gyroscope has lost reference point accuracy comprises comparing the first difference and the second difference to model differences for a drifting reference point scenario.

9. The method of claim 1 wherein the antenna system includes a monopole antenna support.

10. The method of claim 1 wherein the antenna system includes a lattice tower antenna support.

11. A gyroscope monitoring system for an antenna system that has a gyroscope that controls positioning of multiple antennas, the method system comprising:

a communication interface configured to receive reference data indicating a first reference signal strength for a first one of the antennas and a second reference signal strength for a second one of the antennas and to receive test data indicating a first test signal strength for the first one of the antennas and a second test signal strength for the second one of the antennas;

a processing system configured to process the reference data and the test data to determine a first difference between the first reference signal strength and the first test signal strength and a second difference between the second reference signal strength and the second test signal strength, to process the first difference and the second difference to determine if the gyroscope has lost reference point accuracy, and if the gyroscope has lost reference point accuracy, to generate an indication that the gyroscope has lost reference point accuracy; and the communication interface is further configured to transfer the indication that the gyroscope has lost reference point accuracy.

12. The gyroscope monitoring system of claim 11 wherein the processing system is further configured to determine reference point offsets for the gyroscope.

13. The gyroscope monitoring system of claim 12 wherein the communication interface is configured to transfer the reference point offsets to the gyroscope, wherein the gyroscope uses the reference point offsets for motion measurement.

14. The gyroscope monitoring system of claim 12 wherein:

the communication interface is configured to receive angle data indicating a reference angle previously used for optimal signal strength and a test angle that currently provides optimal signal strength;

the processing system is configured to process a difference between the reference angle previously used for optimal signal strength and the test angle that currently provides optimal signal strength to determine the reference point offsets.

15. The gyroscope monitoring system of claim 14 wherein:

the communication interface is configured to receive azimuth data indicating a reference azimuth previously used for optimal signal strength and a test azimuth that currently provides optimal signal strength;

the processing system is configured to process a difference between the reference azimuth previously used for optimal signal strength and the test azimuth that currently provides optimal signal strength to determine the reference point offsets.

16. The gyroscope monitoring system of claim 15 wherein the processing system is configured to process the first difference between the first reference signal strength and the first test signal strength and the second difference between the second reference signal strength and the second test signal strength to determine the reference point offsets.

17. The gyroscope monitoring system of claim 12 wherein the processing system is configured to determine the reference point offsets in response to determining that the gyroscope has lost reference point accuracy.

18. The gyroscope monitoring system of claim 11 wherein the processing system is configured to compare the first difference and the second difference to model differences for a drifting reference point scenario.

19. The gyroscope monitoring system of claim 11 wherein the antenna system includes a monopole antenna support.

20. The gyroscope monitoring system of claim 11 wherein the antenna system includes a lattice tower antenna support.

* * * * *